(12) United States Patent
Ziadeh et al.

(10) Patent No.: US 10,529,600 B2
(45) Date of Patent: Jan. 7, 2020

(54) DECOUPLING SYSTEMS

(71) Applicant: Intel Corporation, Santa Clara, CA (US)

(72) Inventors: Bassam M. Ziadeh, Gilbert, AZ (US); Nathan P. Heckathorne, Chandler, AZ (US); Douglas Heymann, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 363 days.

(21) Appl. No.: 15/474,171

(22) Filed: Mar. 30, 2017

(65) Prior Publication Data

US 2018/0286832 A1 Oct. 4, 2018

(51) Int. Cl.
*H01L 21/67* (2006.01)
*H01L 21/683* (2006.01)
*H01L 23/00* (2006.01)

(52) U.S. Cl.
CPC .... *H01L 21/67132* (2013.01); *H01L 21/6838* (2013.01); *H01L 24/799* (2013.01); *H01L 24/98* (2013.01); *H01L 2221/68318* (2013.01); *H01L 2221/68336* (2013.01); *H01L 2221/68386* (2013.01)

(58) Field of Classification Search
None
See application file for complete search history.

(56) References Cited

U.S. PATENT DOCUMENTS

2013/0272837 A1* 10/2013 Nakazawa ........ H01L 21/67132
414/800

* cited by examiner

*Primary Examiner* — Barbara J Musser
(74) *Attorney, Agent, or Firm* — Schwegman Lundberg & Woessner, P.A.

(57) ABSTRACT

A decoupling system includes a deflection plate configured for coupling across a low pressure orifice of a low pressure chamber. The deflection plate includes one or more vacuum pores extending through the deflection plate. A peeling flange is coupled with a remainder of the deflection plate at a compliant joint. A die profile opening extends from the compliant joint around the peeling flange in the shape of a die profile. The die profile opening separates the peeling flange from the remainder of the deflection plate. The peeling flange includes relaxed and peeling configurations configured to decouple a die from a die media. In the relaxed configuration the peeling flange is coincident with the remainder of the deflection plate. In the peeling configuration the peeling flange is deflected, and at least a portion of the flange is spaced from the remainder of the deflection plate.

19 Claims, 7 Drawing Sheets

DECOUPLING SYSTEMS

TECHNICAL FIELD

This document pertains generally, but not by way of limitation, to the removal of packages, such as dice, from a transportation media or storage media.

BACKGROUND

Wafers are bound to a transfer or storage media, such as Mylar, for ease of transportation and storage after singulation of the wafer into dice. When transfer of one or more dice from the singulated wafer is desired a die is removed from the media and moved to a tray, tape and real or the like for further processing downstream, including the bonding of a die to a substrate (e.g., a package).

In some examples, the die is removed from the media by prying of the die with an array of needles. The array of needles are engaged against a surface of the media opposed to the surface the die is adhered upon. The die is coupled with a manipulator for instance by pneumatic suction. The needle array is driven upwardly into the media. The engagement of each of the needles is transmitted through the media to the die. At the same time the manipulator is moved upward correspondingly to the movement of the needle array. The force transmitted through the media pries the die away from the media thereby decoupling the die from the media. The manipulator transports the decoupled die to a tray, tape and real or the like.

In other examples, the media includes a heat activated material, such as a heat activated Mylar. When decoupling of a die from the media is desired the media is locally heated near the die. Once the media is heated the adhesion between the die and media is broken and the die is removed, for instance with a manipulator.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
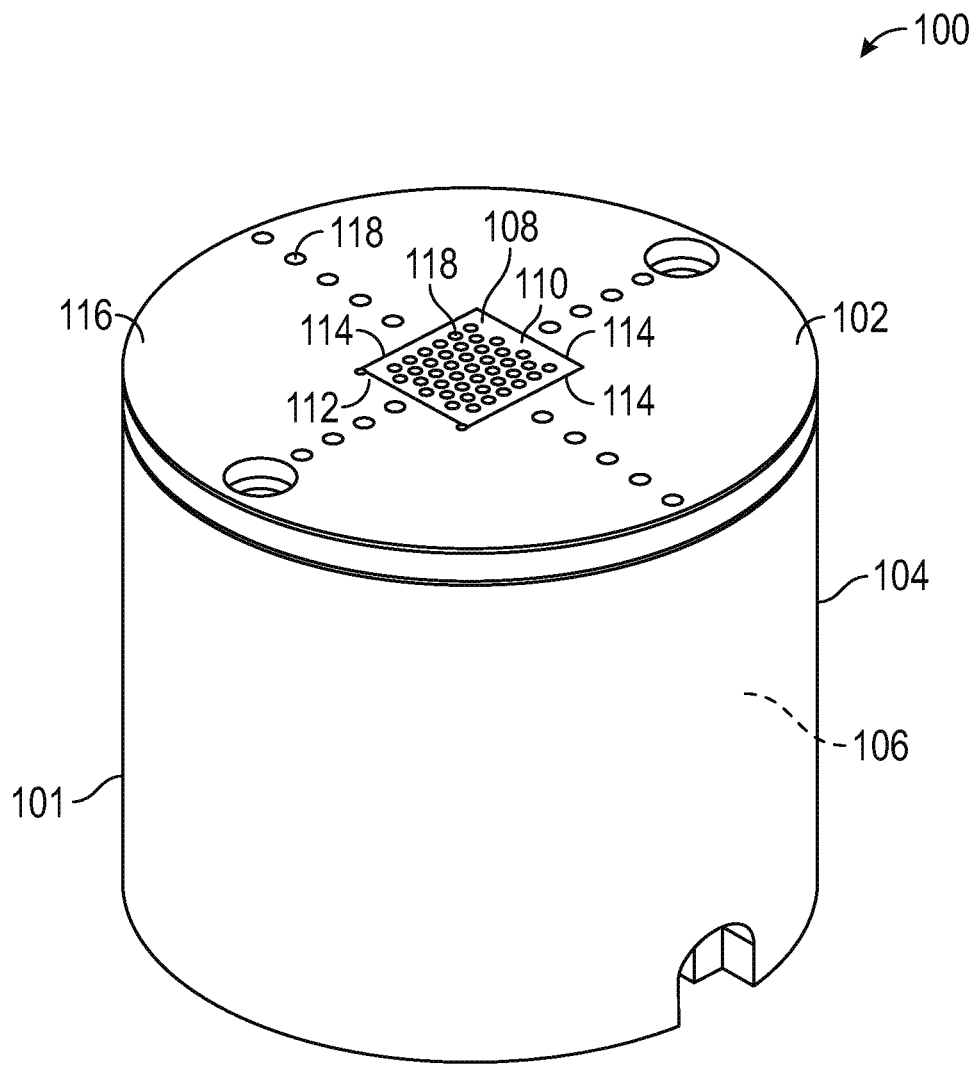
FIG. 1 is a side view of one example of a decoupling system.

The present inventors have recognized, among other things, that a problem to be solved can include minimizing stresses on the die caused with decoupling of the die from a transport or storage media (e.g., media or die media). A needle array generates significant point loads and corresponding localized (and relatively large) stresses in the die. In at least some examples, the point loads from the needle array create fractures in the die or propagate fractures already present in the die that may cause a device, including the die, to fail. After decoupling from the media, the die is processed in additional steps including one or more of bonding of a chip with the die, heat treating or the like. Faults in a die caused by fractures, created or aggravated by the point loading with the needle array, are (in at least some examples) not detectable until electrical testing after these processing steps. Accordingly, significant time, labor and value are added to a faulty die that must be discarded or recycled.

This phenomena is further enhanced with the industry goal of making thinner devices with thin, less robust, dice (e.g., for use in small scale devices such as tablets, mobile phones and the like). Thin dice are subject to greater deflection under point loads and corresponding greater stresses, and are accordingly prone to aggravated fracturing.

The present subject matter can help provide a solution to this problem, such as with a decoupling system configured to peel the die media from a die. The decoupling system includes a deflection plate configured for reception of the die media with the die adhered on the media. The die (adhered to the die media) is aligned with a peeling flange of the plate (e.g., in one example corresponding to a die profile opening). The die media is fastened to the deflection plate. The peeling flange is deflected (e.g., rotated and bent, curved, peeled or the like) away from the die. Because the die media is fastened to the peeling flange the media moves with the deflected flange. The deflection forms a linear separation gap between the die and the die media. In one example, the linear separation gap includes a shape corresponding to one or more of a flange end of the peeling flange (e.g., separated from the remainder of the deflection plate) or a die profile opening, such as the channel formed between the peeling flange and the remainder of the deflection plate. The linear separation gap propagates across the die as the peeling flange and the fastened die media are further deflected. Because the die is separated from the die media along a line and the die media peels away (e.g., along the linear separation gap) point loading of the die is minimized (e.g., minimized or eliminated) and the corresponding stresses incident on the die are decreased.

The decoupling system reliably decouples dice from the die media while minimizing the generation or aggravation of fractures in the dice. Further, because the decoupling system peels the die media from the dice and thereby distributes stresses along the dice (e.g., as opposed to point loading with needle arrays) the decoupling system is readily used with thin dice that are otherwise prone to the generation or aggravation of fractures when separated from a media with a needle array.

This overview is intended to provide an overview of subject matter of the present patent application. It is not intended to provide an exclusive or exhaustive explanation of the disclosure. The detailed description is included to provide further information about the present patent application.

FIG. 1 shows one example of a decoupling system 100. In the example the decoupling system 100 includes a decoupler assembly 101. As further described herein, in yet another example, the decoupling system 100 includes a decoupler assembly 101 as well as a picking assembly 204 configured to fasten with a die or other semiconductor to facilitate peeling of a die media from the die. The decoupler assembly 101 of the decoupling system 100 includes a decoupler housing 104 surrounding a low pressure chamber 106. As further shown in FIG. 1, the decoupler assembly 101 includes a deflection plate 102 coupled across a portion of the decoupler housing 104 (e.g., a low pressure orifice such as the orifice 208 shown in FIG. 2). As will be described herein, the deflection plate 102 includes features to facilitate the removal of a die from a die media, such as a polymer including, but not limited to, biaxially-oriented polyethylene terephthalate (BoPET, having the trade name Mylar). The deflection plate 102 includes a peeling flange 108 configured to facilitate the decoupling of the die media from a die.

As further shown in FIG. 1, the decoupler assembly 101 provides a low pressure chamber 106 as described herein. In another example, an actuator (e.g., a removable stage or the like) is provided within the low pressure chamber 106 and configured for coupling with the deflection plate 102. As will be described herein, the movable stage or actuator operates to deflect a portion of the deflection plate 102 including, for instance, the peeling flange 108 to peel the die media from the die and thereby facilitate the removal of the die from the die media for storage, further processing or the like.

Referring again to FIG. 1, as previously described the deflection plate 102 includes a peeling flange 108. In one example, the peeling flange 108 is bounded at least in part by a die profile opening 114. The die profile opening 114 isolates the peeling flange 108 from the remainder of the deflection plate 102. As shown in FIG. 1, the die profile opening 114 extends around the peeling flange 108 with another side of the peeling flange 108 including a compliant hinge 112. As shown in FIG. 1, the compliant hinge 112 optionally extends between sides of the die profile opening 114. The die profile opening 114, in one example, has a corresponding profile to a die, such as a die adhered to a die media. As will be described herein, by providing the die profile opening 114 in the shape of a corresponding die, the die media adhered to the die is readily removed, for instance, by way of the peeling flange 108.

As further shown in FIG. 1, the peeling flange 108 includes a flange end 110. The flange end 110 includes in one example a linear feature extending across the peeling flange 108 and remote from an opposed side of the peeling flange 108 including the compliant hinge 112. As will be described herein, in one example, the shape of the flange end 110 and the die profile opening 114 controls the generation and propagation of a linear separation gap between the die media and the die positioned over the deflection plate 102. The peeling flange 108 of the deflection plate 102 further includes the compliant hinge 112 (e.g., a living hinge, joint or the like) configured to permit the deflection of the peeling flange 108 relative to the remainder of the deflection plate 102 including, for instance, a plate perimeter 116. In one example, the peeling flange 108 is configured to move by way of actuation by the moveable stage within the decoupler assembly 101 into a deflected or curved configuration to facilitate the drawing of a portion of the die media away from the die statically held above the peeling flange 108.

As further shown in FIG. 1, the deflection plate 102 includes one or more vacuum pores 118 provided on at least the peeling flange 108. In another example, the vacuum pores 118 are provided at a plurality of locations on the deflection plate 102 including, but not limited to, the peeling flange 108, the plate perimeter 116 and the like. The vacuum pores 118, in one example, are used in combination with a low pressure fluid (e.g., air) in the low pressure chamber 106 to fasten the die media (and the die adhered thereon) to the deflection plate 102 before and during operation of the decoupling system 100. By fastening the die media to the deflection plate 102, for instance, to the peeling flange 108, the deflection of the peeling flange 108 accordingly moves the die media away from the suspended die and thereby peels the die media away from the die itself. In cooperation with the die profile opening 114 the peeling flange 108 generates a linear separation gap between the die and the die media (adhered to the peeling flange) to minimize localized (e.g., point) stresses incident on the die while at the same time providing consistent and reliable removal of the die media from the die. Further, in at least some examples, the pressure gradient between the upper and lower surfaces of the die media (generated with the low pressure fluid in the chamber 106) initiates the linear separation gap of the die media from the die along the die profile opening 114 and the peeling flange 108 edges including the flange end 110.

Figure 2:
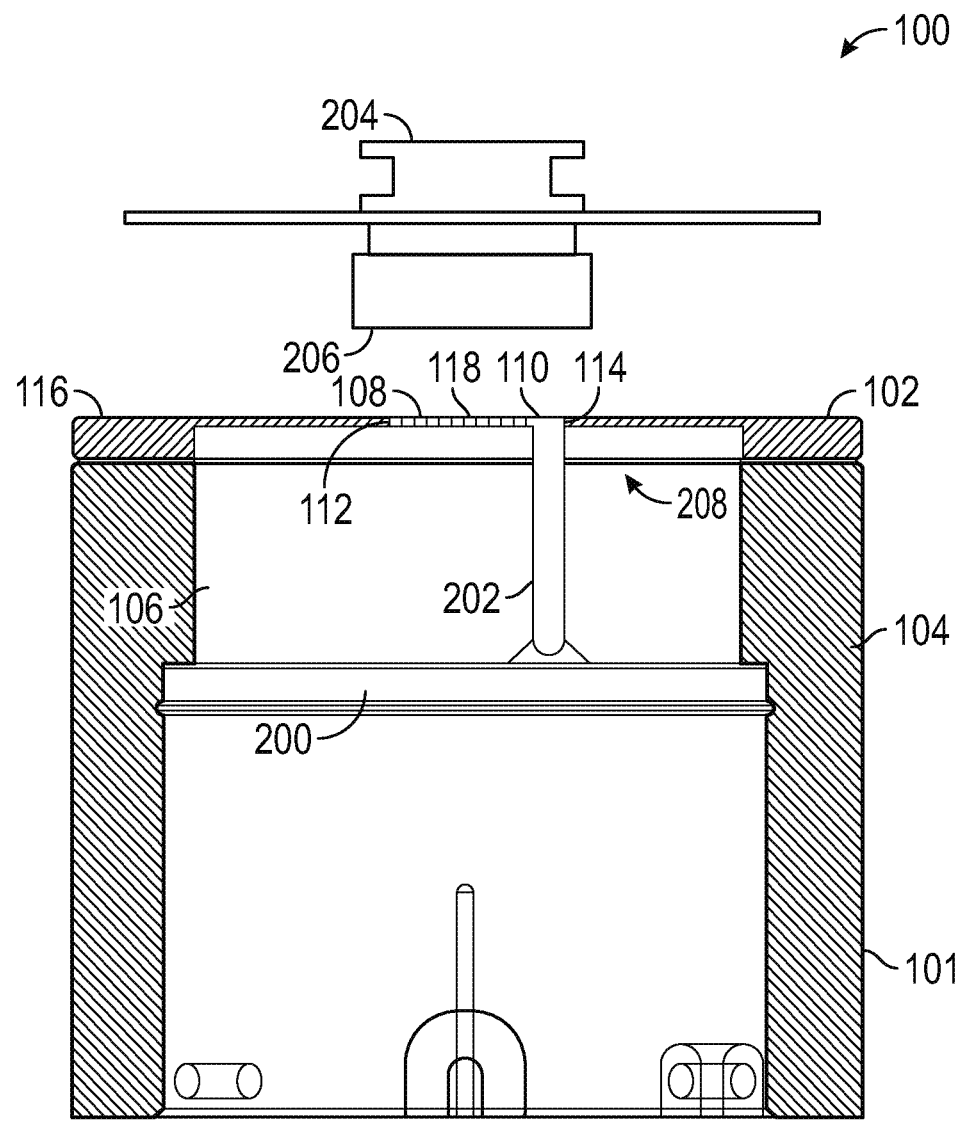
FIG. 2 is a schematic view of one example of a decoupler assembly including a deflection plate and a movable stage.

Referring now to FIG. 2, a partial cross-sectional view of the decoupling system 100 previously shown in part in FIG. 1 is provided. In this example, the decoupling system 100 includes a picking assembly 204 as well as the decoupler assembly 101. Referring first to the decoupler assembly 101, as previously described the decoupler assembly 101 includes a decoupler housing 104 including the low pressure chamber 106 therein. In one example, the low pressure chamber 106 is in communication with a source of negative pressure, for instance, a vacuum pump or the like configured to decrease the pressure within the decoupler housing 104 relative to an exterior pressure, for instance, the pressure incident on an opposed surface of the die media positioned on the deflection plate 102.

As further shown in FIG. 2, the picking assembly 204 is shown in an elevated position relative to the deflection plate 102. As shown, the picking assembly 204, in one example, includes a die interface 206 configured to fasten along a surface of a die, for instance, a die coupled with the die media such as Mylar or other flexible polymer. The die interface 206 includes, but is not limited to, a suction interface, for instance, a pneumatic suction interface, an adhesive, suction cup or the like configured to fasten the picking assembly 204 with the die while the die is positioned on the die media on the deflection plate 102. The picking assembly 204 holds the die in a static position while a portion of the deflection plate 102 such as the peeling flange 108 is deflected to peel the die media from the statically held die. In one example, the picking assembly 204 is coupled with or is part of a moveable arm, actuator or the like configured to move the decoupled die relative to the decoupler assembly 101, for instance, for storage, further processing or the like.

As further shown in FIG. 2, the deflection plate 102 is shown in partial cross-section (the peeling flange itself is not cross hatched to facilitate description), for instance, with the peeling flange 108 extending from the compliant hinge 112 to the flange end 110. As previously described, in one example, the flange end 110 as well as the remainder of the peeling flange 108 have a profile corresponding to the shape and size of the die to be removed from its die media. As further shown in FIG. 2, the deflection plate 102, including the peeling flange 108, is installed across a low pressure orifice 208 of the decoupler housing 104. By providing the deflection plate 102 across the low pressure orifice 208, the pressure gradient provided by a low pressure fluid within the low pressure chamber 106 in cooperation with a higher pressure fluid, for instance, to the exterior of the decoupler housing 104 fastens a die media and the die thereon to the deflection plate 102 to facilitate peeling of the die media from the die as described herein.

As further shown in FIG. 2, the deflection plate 102 includes the peeling flange 108. The peeling flange is, in turn, coupled with a moveable stage 200. In one example, the moveable stage 200 is an actuator coupled with the peeling flange 108 (e.g., directly or indirectly) to deflect the peeling flange 108 relative to the remainder of the deflection plate 102, such as the plate perimeter 116, to thereby deflect the peeling flange 108 (and the fastened die media) away from the die positioned statically with the picking assembly 204. The fastened die media is thereby peeled from the held die.

In one example, the peeling flange 108 includes a peeling lug 202 providing an interface or coupling between the peeling flange 108 and the moveable stage 200. As shown in FIG. 2, in one example, the peeling lug 202 is a direct coupling between the peeling flange 108 and the moveable stage 200. Accordingly, motion of the moveable stage 200 is directly transmitted to the peeling flange 108 to accordingly deflect the peeling flange 108 relative to the remainder of the deflection plate 102, for instance, rotating, curling, curving, bending, arcing or the like, the peeling flange 108 around the compliant hinge 112.

As will be described herein, in yet another example, the peeling flange 108 is coupled indirectly with the moveable stage 200 with one or more transmissions. The transmissions, in one example, are configured to translate the movement of the moveable stage 200 into a specified movement (direction, speed, force applied or the like) applied to the peeling flange 108. For instance, where the moveable stage 200 is configured to move when powered in an upward fashion the transmission is interposed between the peeling flange 108 and the moveable stage 200 to accordingly transform the upward vertical movement of the moveable stage 200 into corresponding descending movement of the peeling flange 108 (e.g., rotation of the peeling flange around the compliant hinge 112). In another example, the transmission interposed between the peeling flange 108 and the moveable stage 200 is configured to modify the movement provided by the moveable stage 200. Accordingly, the transmission steps up or steps down movement of the moveable stage 200 and correspondingly moves the peeling flange 108 accordingly to the change in movement.

In operation, the decoupling system 100 shown in FIG. 2 is coupled with a die media including an adhered die thereon. For instance, the die media is fastened across the deflection plate 102. In one example, the die media is fastened across the deflection plate 102 with a pressure gradient created between the low pressure chamber 106 and an exterior environment (having atmospheric pressure in at least some examples) by way of the vacuum pores 118. After the die media is fastened to the deflection plate 102, the die interface 206 is engaged with the die and accordingly affixed to it. By fastening the die to the die interface, the die remains static throughout operation of the deflection plate 102 including, for instance, deflection of the peeling flange 108 from a first relaxed configuration to a peeling configuration and finally to a decoupled configuration where the die is decoupled from the die media.

In one example, the moveable stage 200 coupled with the peeling flange 108 is operated, for instance, the moveable stage 200 as shown in FIG. 2 is moved to the downward direction to thereby pull the peeling flange 108 (a cantilevered feature of the deflection plate in this example) in a downward fashion relative to the remainder of the plate perimeter 116. As the peeling flange 108 is deflected, for instance, by way of force applied to the peeling flange 108 proximate to the flange end 110, the die media fastened to the peeling flange 108 is deflected away from the die with the peeling flange. Accordingly, a separation gap having a similar shape (e.g., matching, identical or the like) to one or more of the flange end 110, the die profile opening 114 or the like is formed between the die and the die media. In another example, the application of the pressure gradient to the die media deflects the die media into the die profile opening 114 and initiates the separation gap between the die and the die media. Optionally, the separation gap is initiated in combination by the application of the pressure gradient and initial deflection of the peeling flange 108.

With continued movement of the moveable stage 200, for instance, in a downward fashion, the peeling flange 108 continues to deflect and the linear separation gap formed between the die and the die media fastened with the peeling flange 108 is enlarged as the linear separation gap propagates toward the compliant hinge 112. With further deflection of the peeling flange 108, the linear separation gap extends across the entirety of the die thereby separating the die from the die media. As will be described herein, the linear separation gap provides a distributed stress across the die and thereby minimizes point loading (e.g., minimizes or eliminates) of the die to minimize (e.g., minimize or eliminate) the propagation or formation of fractures in the die.

Figure 3:
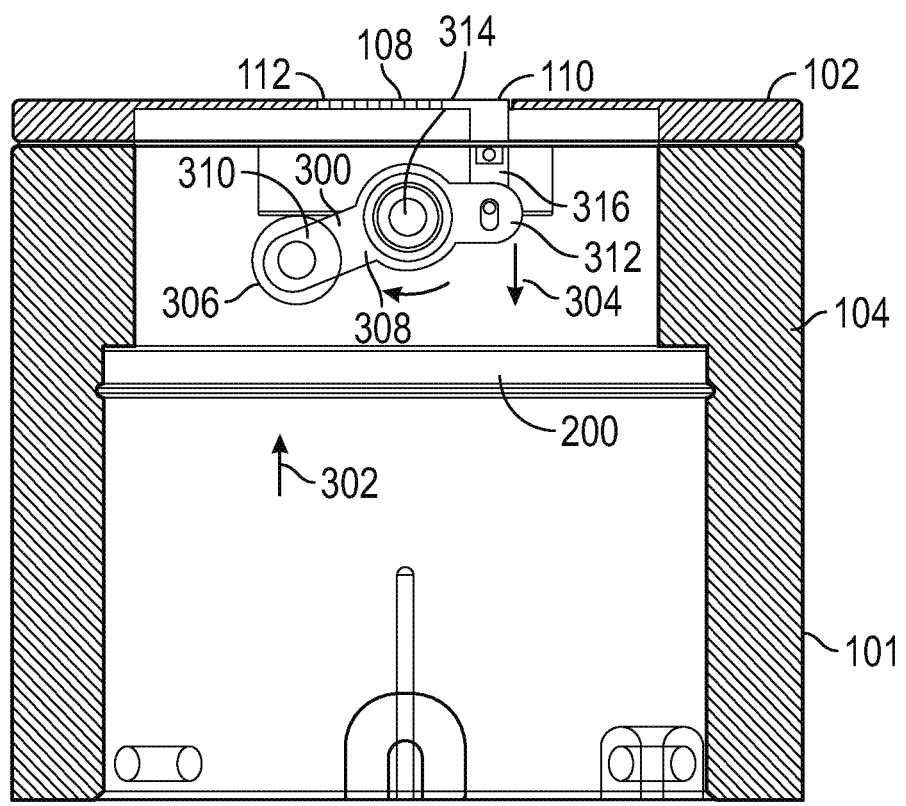
FIG. 3 is a cross sectional view of the decoupling system of FIG. 1 with the section taken through the decoupler assembly.

FIG. 3 shows one example of a transmission 300 optionally coupled between the deflection plate 102 and the moveable stage 200. In this example, the transmission 300 converts upward motion of the moveable stage 200 into corresponding downward motion of the peeling flange 108. For instance, in one example, where the deflection plate 102 is provided as an aftermarket modification to an existing decoupler assembly 101, the transmission 300 provides one example mechanism configured to transform a first motion such as the first motion 302 into a second opposed motion 304 (e.g., downward). Accordingly, even with an existing decoupler assembly 101 having a moveable stage 200 configured to press one or more features, for instance, a needle array into an assembly of a die and die media, such a decoupler assembly 101 is reconfigurable, for instance, with the transmission 300 described herein to accordingly use the deflection plate 102 including the peeling flange 108.

Referring again to FIG. 3, in the example shown, the transmission 300 includes a roller bearing 306 configured for rolling engagement along, for instance, the moveable stage 200. In one example, the roller bearing 306 provides rolling engagement along a piston face of the moveable stage 200. Further, the transmission 300 includes a lever, such as the lever 308 extending between the roller bearing and a peeling lug 316 provided with the peeling flange 108. As shown in the example provided, the lever 308 includes a drive end 310 extending between the roller bearing 306 and an axle 314 and a driven end 312 extending from the axle 314 to a point of coupling with the peeling lug 316. As shown in this example, the drive end 310 has a larger moment arm relative to the driven end 312. In other examples, the lever 308 is arranged conversely, for instance, the driven end 312 is longer than the drive end 310.

In operation, the transmission 300 is held in place by the axle 314. For instance, in one example, the axle 314 is statically coupled with the decoupler housing 104 (e.g., the axle 314 extends into and out of the page, for instance, into engagement with the corresponding walls of the decoupler housing 104). As the moveable stage 200 is moved upwardly, the roller bearing 306 engages and rolls across the moveable stage 200. The drive end 310 is rotated (in this example) clockwise and the entirety of the lever 308 accordingly rotates clockwise around the axle 314. The rotation of the lever 308 is transmitted to the driven end 312 and accordingly moves the peeling lug 316 in a downward fashion shown with the second motion 304. The first motion 302 of the stage 200 is thereby transformed into a downward second motion 304 to accordingly deflect the peeling flange 108 from the relaxed configuration (shown, for instance, in FIG. 3) into a peeling configuration where the peeling flange 108 is deflected relative to the remainder of the deflection plate 102 to facilitate decoupling of the die media from the die.

The transmission 300 shown in FIG. 3 is one example of a transmission usable with the decoupler assembly 101 including one or more of the deflection plate 102 having the peeling flange 108 or the like. In other examples, the decoupler assembly 101 including, for instance, the deflection plate 102 is without a transmission 300. As shown in FIG. 2, the peeling flange 108 is coupled directly or indirectly with the moveable stage 200, for instance, by way of the peeling lug 202. In still other examples, transmissions similar or different from the transmission shown in FIG. 3 are included with the decoupler assembly 101. Transmissions include, but are not limited to, mechanisms configured to increase or decrease the quantity of the second motion 304 relative to the first motion 302. In one example, for instance, as shown in FIG. 3, the drive end 310 has a longer moment arm compared with the driven end 312. Accordingly, the translation of the drive end 310, for instance, corresponding to the first motion 302 results in a smaller corresponding second motion 304 (in the opposed direction). In a converse arrangement, for instance, with the drive end 310 shorter than the driven end 312, the second motion 304 is greater relative to the first motion 302. In still other examples, the transmission 300 includes other mechanisms coupled between the moveable stage 200 and the peeling flange 108. For instance, transmissions 300 include, but are not limited to, cam and cam follower arrangements, multi-bar mechanisms or the like.

Figure 4A:
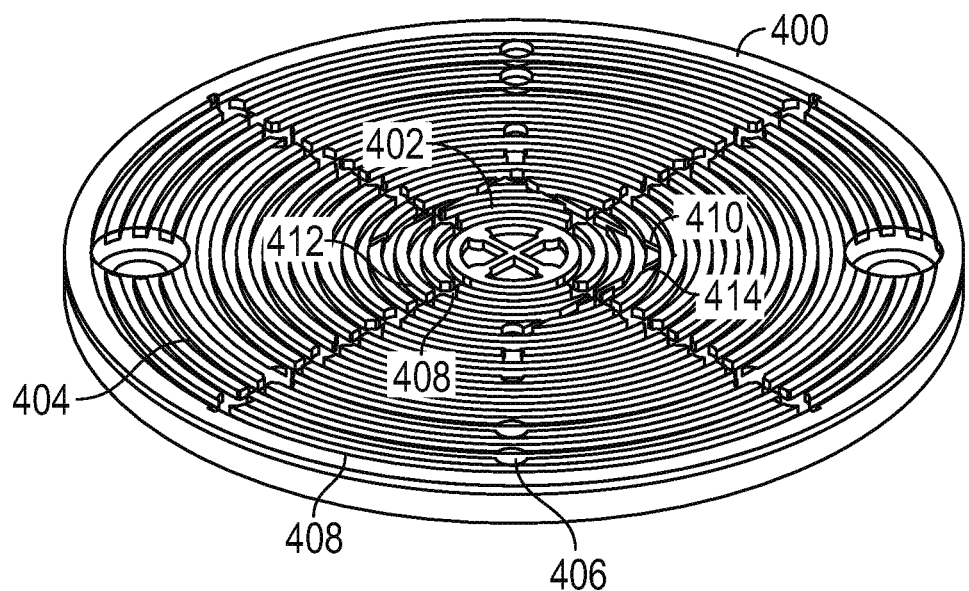
FIG. 4A is a perspective view of one example of the deflection plate.
Figure 4B:
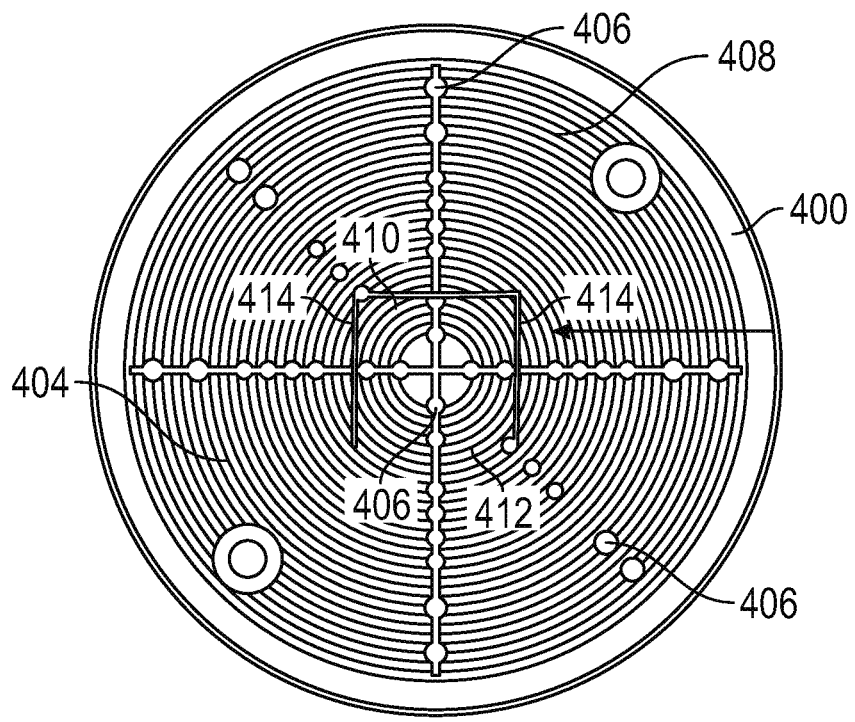
FIG. 4B is a top view of the deflection plate of FIG. 4A.

FIGS. 4A and 4B show perspective and top views of another example of a deflection plate 400. The deflection plate 400 includes similar features in some regards to the deflection plate 102 previously shown and described in FIGS. 1, 2 and 3. Referring to FIGS. 4A and 4B, the deflection plate 400 includes a plate perimeter 404 extending (continuously or optionally discontinuously) around a peeling flange 402. The peeling flange 402 shown in FIG. 4A is deflectable with respect to the remainder of the deflection plate 400 including the plate perimeter 404. As shown, for instance, in both FIGS. 4A and 4B, the peeling flange 402 is bounded on three sides in this example by a die profile opening 414. The die profile opening 414 corresponds to a cut, ridge, opening or the like provided between at least portions of the peeling flange 402 and the plate perimeter 404. As shown, for instance, in FIGS. 4A and 4B, the die profile opening 414 extends from a compliant hinge 412 coupling the peeling flange 402 with the remainder of the deflection plate 400. The die profile opening 414 has, in at least one example, a corresponding shape to a die, for instance, a die adhered to a die media to facilitate the removal of the die from the die media with the deflection plate 400. For instance, during operation the die on the die media is aligned or made coincident with the peeling flange 402 (including aligning or making coincident with the die profile opening 414) prior to operation of the deflection plate 400.

As further shown, the peeling flange 402 is coupled with the deflection plate 400 with the compliant hinge 412. In some examples, the compliant hinge 412 is integral to the deflection plate 400. For instance, the peeling flange 402 and the plate perimeter 404 of the deflection plate 400 are constructed with identical materials, for instance, spring steel or the like and the compliant hinge 412 accordingly forms a living hinge constructed from the same material. In other examples, the peeling flange 402 and the plate perimeter 404 are constructed separately and the compliant hinge 412 is a hinge interposed between the peeling flange 402 and the plate perimeter 404. In such an example, the compliant hinge 412 optionally includes a mechanical hinge such as a pin received within a slot, aperture or the like configured to facilitate the rotation of the peeling flange 402 relative to the remainder of the deflection plate 400 including, for instance, the plate perimeter 404. In one example, the compliant hinge 412 includes a separate biasing element such as a spring, elastomeric material or the like interposed between a portion of the peeling flange 402 and, for instance, the decoupler housing 104, the plate perimeter 404 or the like. In such an example, the biasing element operates in a similar manner, for instance, to a spring bias provided by a living hinge to bias the peeling flange 402 into the relaxed configuration shown, for instance, in FIGS. 4A and 4B. Upon deflection of the peeling flange 402, for instance, by way of operation of a stage such as the moveable stage 200 shown in FIG. 2, the moveable stage overcomes the bias provided by this biasing element and accordingly moves the peeling flange 402 into a peeling configuration to accordingly separate the die media from the die.

As further shown in FIGS. 4A and 4B, the deflection plate 400 includes a plurality of vacuum pores 406 distributed across the deflection plate 400. In at least one example, the vacuum pores 406 are provided on the peeling flange 402 to accordingly ensure fastening of the die media coincident with the die to the peeling flange 402. The fastening of the die media to the peeling flange 402 ensures that movement of the peeling flange 402 is transmitted to the die media to accordingly separate the die media from the die itself. In other examples, for instance, in the examples shown in FIGS. 4A and 4B, both the plate perimeter 404 as well as the peeling flange 402 include vacuum pores 406. The vacuum pores 406 ensure fastening of the die media across the deflection plate 400 including the peeling flange 402 and the plate perimeter 404.

In one example, the fastening of the die media across the deflection plate 400 holds the die media in place not only along the peeling flange 402 but also the plate perimeter 404. Accordingly, with deflection of the peeling flange 402, the die media is held in place both on the plate perimeter 404 and on the peeling flange 402. Accordingly the die media deflects (e.g., stretches) according to the fastening between each of these features. The plastic deformation of the die media, for instance, between the peeling flange 402 and the plate perimeter 404 (where the die media is fastened between both) enhances the breaking of an adhesive bond between the die and the die media. In still other examples, the die media (deformable as described herein) is drawn into one or more of the vacuum pores 406, the die profile opening 414 or the like by the pressure gradient between a low pressure environment (e.g., in the low pressure chamber 106) and a higher pressure environment (e.g., atmospheric pressure outside of the chamber). By drawing and deforming the die media through these features of the deflection plate 400 the plate initiates decoupling of the die media from the die (e.g., initiates separation gaps, such as linear separation gaps along at least the die profile opening 414).

Figure 5A:
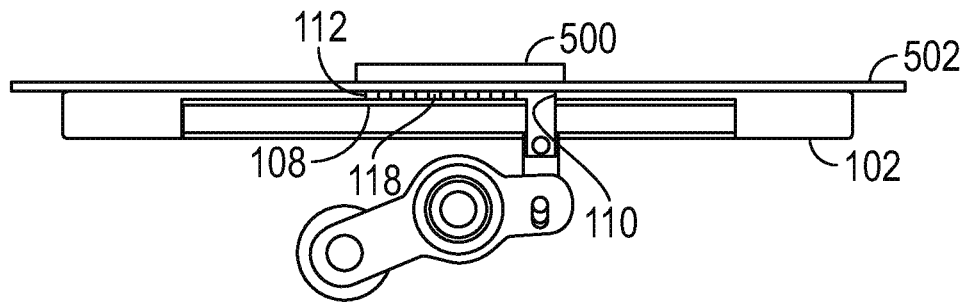
FIG. 5A is a schematic view of a decoupling system with a peeling flange in a relaxed configuration.
Figure 5B:
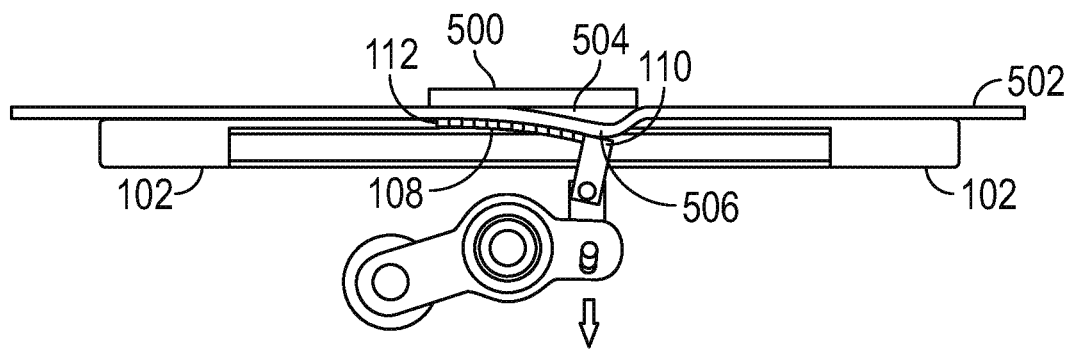
FIG. 5B is a schematic view of the decoupling system with the peeling flange in a peeling configuration.
Figure 5C:
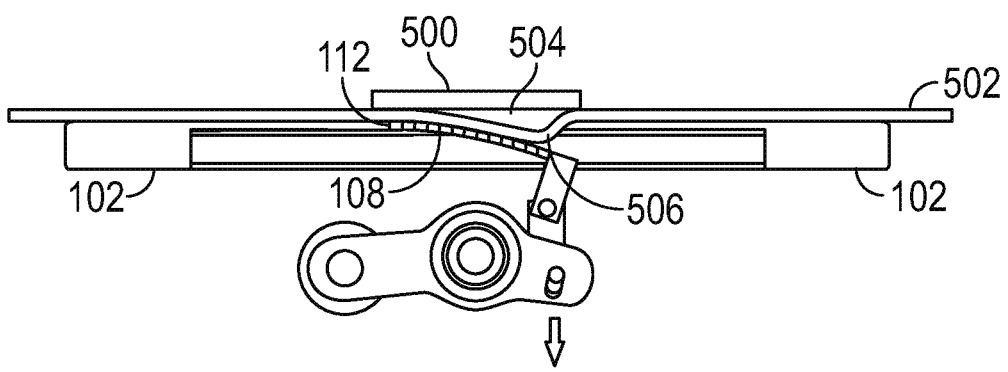
FIG. 5C is a schematic view of the decoupling system with the peeling flange in a decoupled configuration with the die separated from the die media.

FIGS. 5A-C show one example of a die and die media 502 in varying configurations including deformation of the die media 502 relative to the die 500 to accordingly peel the die media away from the die 500. Referring first to FIG. 5A, the die 500 is shown coupled with the die media 502. As previously described herein, the coupling of the die 500 with the die media 502 includes an adhesive coupling formed between the polymer of the die media 502 (in one example, Mylar) with the die 500. The die media 502 is positioned over the deflection plate 102. In one example, the decoupler assembly 101, for instance, as shown in FIG. 2, includes the low pressure chamber 106. The higher pressure fluid, for instance air outside of the decoupler assembly 101, cooperates with the low pressure environment within the low pressure chamber 106 (e.g., by way of the vacuum pores 118) to fasten the die media 502 to the deflection plate 102 according to the pressure differential. As further shown in FIG. 5A, the die media 502 is positioned on the deflection plate 102 with the die 500 coincident with the peeling flange 108. For instance, as shown in either of FIG. 1 or FIG. 4A, the die 500 is positioned at a corresponding position to align or be coincident with the die profile opening, such as the die profile opening 114 shown in FIG. 1 or the die profile opening 414 shown in FIG. 4A. Accordingly, the flange end 110 shown in FIG. 5A is aligned with the corresponding end of the die 500. In this view, the die media 502 is fastened across the deflection plate 102 while the peeling flange 108 is in a relaxed configuration and thereby coincident or flush with the remainder of the deflection plate 102.

As shown in FIG. 5B, the deflection plate 102 including, for instance, the peeling flange 108 is in a peeling configuration relative to the configuration shown in FIG. 5A. In this example, the flange end 110 is moved downwardly relative to the position shown in FIG. 5A. With the peeling flange 108 deflected, for instance biased away from the die 500, the die media 502 coupled along the peeling flange 508, for instance adjacent to the peeling flange 110, is pulled away from the die 500. As previously described herein, in at least one example, the die 500 is statically held in place by a feature such as the picking assembly 204 shown in FIG. 2 having a die interface 206. Accordingly, as the peeling flange 108 is deflected, for instance, curled, bent, angled or the like away from the remainder of the deflection plate 102, the flange end 110 is drawn away from the die 500 along with the corresponding die media 502. As shown in FIG. 5B, a linear separation gap 504 is formed between the die 500 and the portion of the die media 502, for instance, a peeled media portion 506 coupled proximate to the flange end 110. The linear separation gap 504, in one example, follows the contour of the die profile opening 414. For instance, with force applied proximate the flange end 110 (or 410) and according to the shape of the flange end 110 (corresponding to the die profile opening 114, 414) the linear separation gap 504 follows the shape of the flange end 110 (410) and the die profile opening (e.g., 114, 414) to accordingly extend across the interface between the die 500 and the die media 502. Stress transmitted from the die media 502 to the die 500, for instance, as peeling begins and progresses, is transmitted to the die 500 in a substantially linear manner corresponding to the linear separation gap 504 shape in contrast to point loaded stress risers found with needle arrays.

As further shown in FIG. 5C, the die 500 is in a decoupled configuration relative to the die media 502. In this example, the peeling flange 108 continues movement relative to the remainder of the deflection plate 102. For instance, as shown, the peeling flange 108 is further deflected relative to the configuration shown in FIG. 5B and the linear separation gap 504 has propagated along the die 500 to a position adjacent to the compliant hinge 112. Stated another way, the linear separation gap 504 shown originally in FIG. 5B originated adjacent to the flange end 110 and propagated from that position across the die 500 and the die media toward the compliant hinge 112. Accordingly, the linear character of the linear separation gap 504 remains substantially similar (e.g., similar or identical) throughout the decoupling operation and the stresses incident on the die 500 remain distributed across the die 500 and point stresses are consistently and reliably avoided.

The deflection plate 102 included, for instance, with the decoupler assembly 101 of a decoupler system, such as the decoupling system 100 shown in FIG. 1, is thereby configured to generate a linear separation gap 504 between a die 500 and the die media 502 to facilitate the peeling of the die media 502 away from the die 500. The linear separation gap 504 formed, for instance, according to the shape of the flange end 410 (or 110) and the corresponding die profile opening such as the opening 414 (114) controls the generation and shape of the linear separation gap 504. By moving the peeling flange 108, for instance proximate to the flange end 110, the linear separation gap 504 is generated adjacent to the flange end 110 and has a linear shape, for instance, extending across the flange end 110 and the corresponding portion (and end) of the die 500. The linear separation gap 504 propagates from the flange end 110 across the die 500 toward the compliant hinge 112. Accordingly, the linear separation gap distributes stresses across the die 500 in a linear fashion and thereby substantially avoids (e.g., minimizes or eliminates) point loads on the die 500. In other examples, the linear separation gap 504 follows the contour of the die profile opening 414 (or 114). For instance, the linear separation gap 504 is initiated along one or more of the flange end 410 (110) and one or more of the sides of the peeling flange 408 (108) between the flange end and the compliant hinge 412 (112). The separation gap 504 has linear curved configuration that propagates from the edge of the die 500 toward the compliant hinge 412 (112).

Figure 6A:
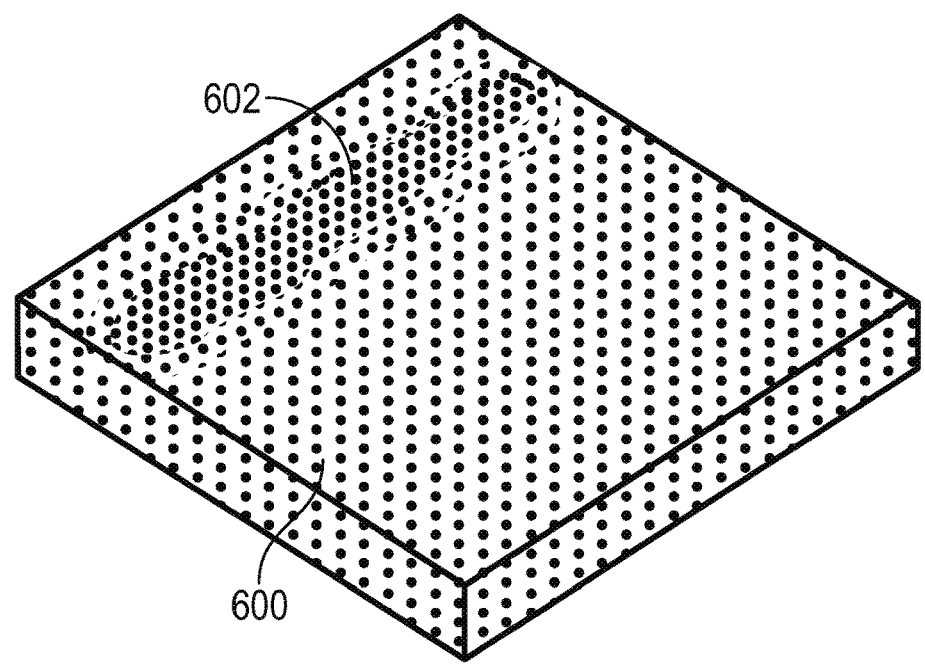
FIG. 6A is an example linear stress plot for a decoupling system including a deflection plate having a peeling flange.
Figure 6B:
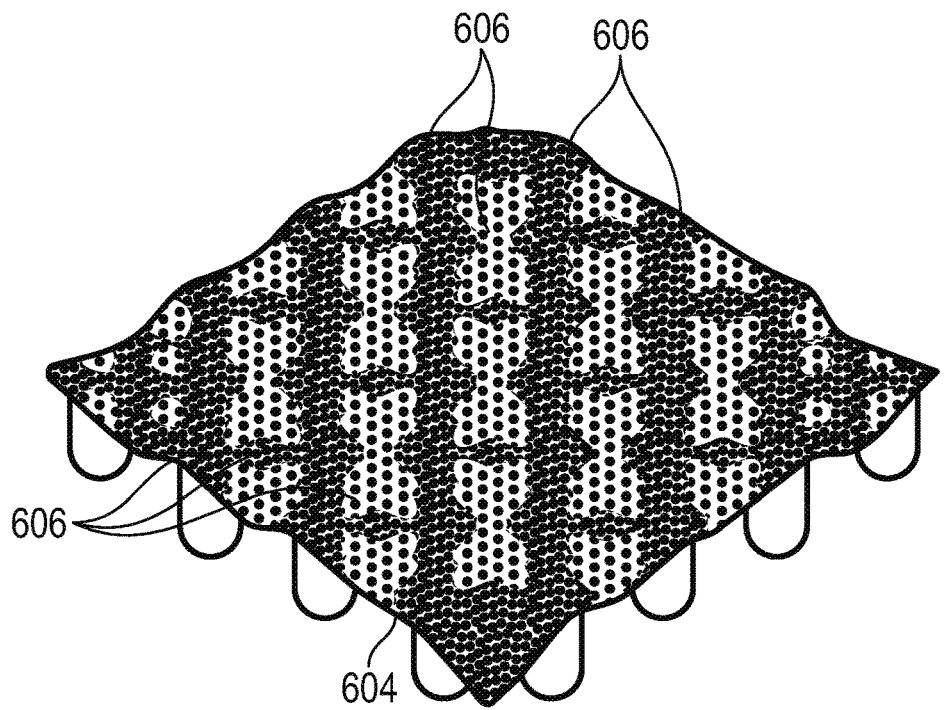
FIG. 6B is an example point stress plot for another decoupling system including a needle array.

FIGS. 6A, B illustrate two plots including a linear stress plot 600 and a localized stress plot 604 for a die, such as the die 500 as the die media 502 is peeled away. Referring first to FIG. 6B, the localized stress plot 604 shows a plurality of point stresses 606 across the die 500. In this example, one or more features, for instance, a needle array of a plurality of needles is engaged against the die 500, for instance, through a die media such as the die media 502. The engagement of the needle array against the die media transmits forces into the die 500 in a localized manner, for instance, corresponding to the point stresses 606 shown in FIG. 6 (having the denser stippling shown). The localized stresses applied to the die 500, in at least some examples, propagate fractures already existing in the die 500, for instance from previous manufacturing steps, or in other examples generate new fractures within the die 500 according to the stresses at the point locations.

Referring to FIG. 6A, in the linear stress plot 600 a distributed stress profile 602 is shown extending across the die, for instance having one example of a linear shape. As shown in the plot, the distributed stress profile 602 has a less dense stippling (compared to the point stresses 606 in FIG. 6B) indicating lesser stresses are incident on the die 500. In each of the example plots, the die 500 is removed from the die media, however, in the linear stress plot 600 (FIG. 6A) the die 500 is decoupled from the die media 502 with significantly decreased stresses across the die 500 because of the deflection plate 102 including the peeling flange 108. Accordingly, the die 500 removed from the die media 502 through deflection of the peeling flange 108 of the deflection plate 102 (or the deflection plate 400 including the peeling flange 402) provides a separated die 500 having a decreased failure rate, for instance due to fractures, whether generated during the decoupling process or propagated by the decoupling process.

Figure 7:
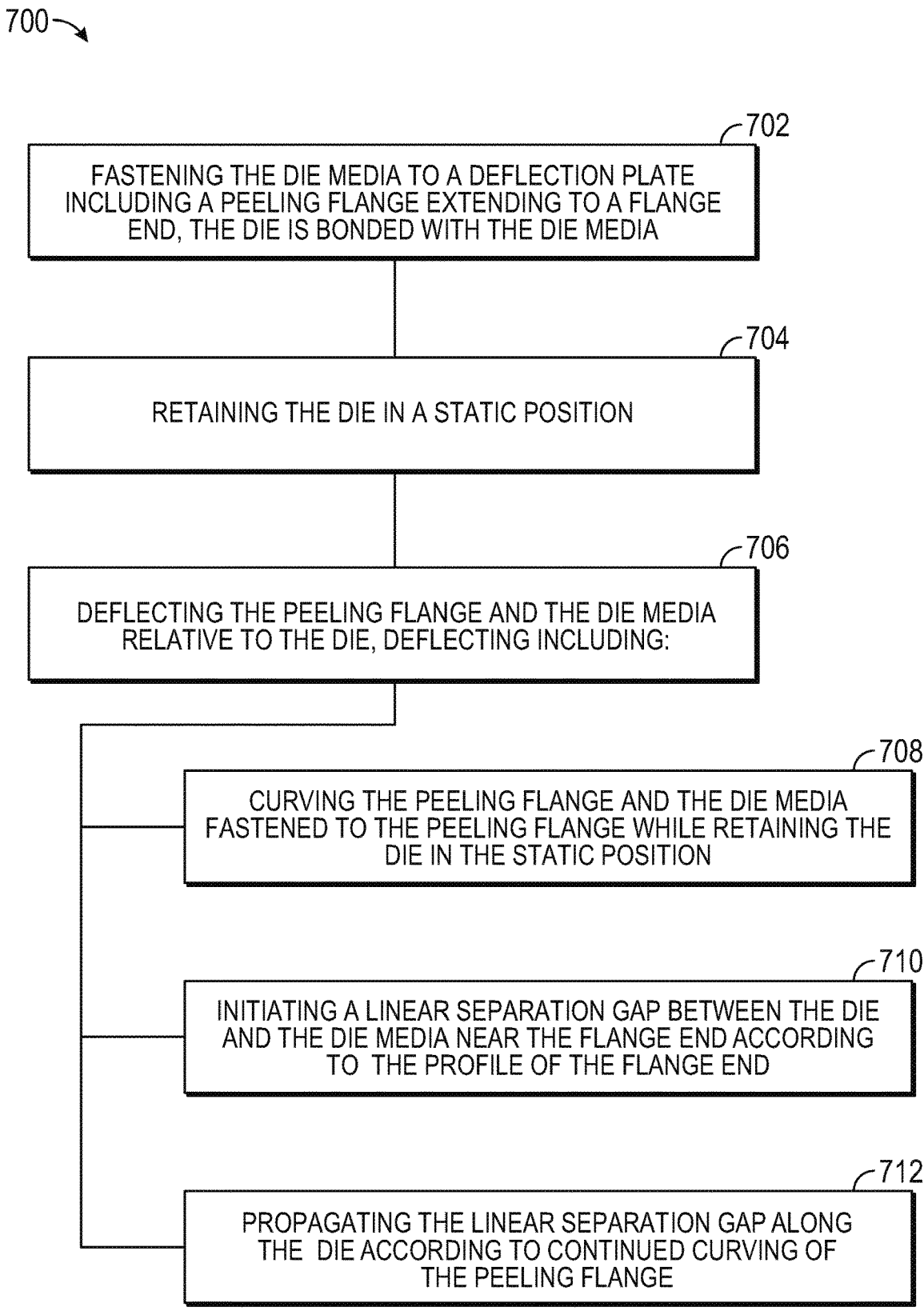
FIG. 7 is a block diagram showing one example of a method for decoupling a die media from a die.

FIG. 7 shows one example of a method 700 for decoupling a die from a die media, for instance, with one or more of the decoupling systems 100 described herein. In describing the method 700, reference is made to one or more components, features, functions and steps previously described herein. Where convenient, reference is made to the components, features, steps and the like with reference numerals. The reference numerals provided are exemplary and are nonexclusive. For instance, components, features, functions, steps and the like described in the method 700 include, but are not limited to, the corresponding numbered elements provided herein, other corresponding elements described herein (both numbered and unnumbered) as well as their equivalents.

In 702, the method 700 includes fastening a die media such as the die media 502 shown, for instance, in FIG. 5A to a deflection plate (one example of which is shown in FIG. 5A as deflection plate 102). The deflection plate 102 includes a peeling flange 108 having a flange end 110. The die media 502 is bonded with a die 500 across an opposed surface of the media relative to the surface fastened to the deflection plate 102. As previously described herein, in one example, the die media 502, including the die 500 coupled thereon is, in one example, fastened to the deflection plate 102 with one or more vacuum pores 118 (e.g., as shown in FIG. 1). In another example, the deflection plate 400 includes a plurality of vacuum pores 406 positioned across the deflection plate 400, for instance, along the plate perimeter 404 as well as the peeling flange 402. By providing a pressure gradient between an interior portion of the decoupler assembly 101, for instance, in a low pressure chamber 106, the die media 502 is reliably fastened across the deflection plate 102.

At 704, the die 500 is retained in a static position. In one example, the decoupling system optionally includes a picking assembly 204 having a die interface 206. The picking assembly 204 is optionally moved (e.g., by an actuator, arm or the like) in to close proximity with the die 500, for instance, shown in FIG. 5A. The die interface 206 is fastened along the die 500 and holds the die 500 in a static position (e.g., shown in the relaxed configuration of FIG. 5A). The die interface 206, as described herein, in some example, includes a suction cup, pneumatic interface (e.g., similar in some regards to the vacuum pores 406 described herein) or other feature configured to reliably hold the die 500 in a static position relative to the die media 502 while the die media is deflected as described herein.

At 706, the peeling flange 108 (and the peeling flange 402 of the deflection plate 400, in another example) is deflected and the die media is deflected with the peeling flange 108 to thereby decouple the die media 502 from the die 500. At 708, in an example, deflecting the peeling flange 108 includes curving (e.g., rotating, bending, curling, arcing or the like) the peeling flange 108 and the die media 502 fastened to the peeling flange while retaining the die 500 in the static position. For instance, as shown in FIG. 5B, the die 500 remains in a substantially static position relative to the deflecting peeled media portion 506 of the die media 502. At least a portion of the peeling flange 108 is in a curved configuration relative to the remainder of the deflection plate 102 and the peeled media portion 506 moves with the deflected portion of the peeling flange 108.

At 710, a linear separation gap 504 (see FIG. 5B) is initiated between the die 500 and the die media 502. In one example, the linear separation gap 504 is proximate the flange end 110 according to the profile of one or more of the flange end, the die profile opening 114 (shown, for instance, in FIG. 1) or the like. In one example, because the peeling flange 108 is deflected, for instance, proximate to the flange end 110, the portion of the peeling flange 108 proximate the peeling flange 110 is spaced (at least initially) a greater distance from the deflection plate 102 compared to the remainder of the peeling flange 108 (e.g., closer to the compliant hinge 112). Accordingly, in this example the linear separation gap 504 is generated at a location initially proximate to the flange end 110 and the corresponding portion of the die profile opening 114. The linear separation gap 504 extends across the die 500 (as shown in FIG. 5B into and out of the page).

As previously described herein, in another example the linear separation gap 504 is, in one example, formed according to the profile of the flange end 110 or the die profile opening 114 providing the gap between the remainder of the deflection plate 102 such as the plate perimeter 116 and the flange end 110. The linear separation gap 504 optionally follows the shape of the die profile opening 114 extends along one or more portions of the peeling flange 108 including the flange end 110 and sides of the peeling flange extending from the flange end 110 toward the compliant hinge 112. The linear separation gap 504 is in this example also propagates toward the compliant hinge 112.

At 712, deflecting the peeling flange 108 further includes propagating the linear separation gap 504 along the die 500 according to continued curving of the peeling flange 108. As shown in FIG. 5C, the portion of the decoupling system 100, including the deflection plate 102, is shown in a decoupled configuration with the peeling flange 108 further deflected relative to the orientation shown in FIG. 5B. As shown, the peeled media portion 506 has grown, for instance, extending along the peeling flange 108 to the compliant hinge 112. Accordingly, the linear separation gap 504 previously generated between the die 500 and the die media 502 proximate to the flange end 110 (or optionally proximate to the die profile opening 114) has propagated toward the compliant hinge 112 to accordingly decouple the die 500 from the die media 502. As previously described herein, the linear separation gap 504 when propagated in this manner ensures a distributed application of stress to the die 500 that substantially minimizes (e.g., minimizes or eliminates) point loading and accordingly decreases the propagation and origination of fractures within the die 500 otherwise caused by localized point loading of the die 500, for instance, with a needle array.

Several options for the method 700 follow. In one example, fastening the die media 502 to the deflection plate 102 includes aligning the die 500 with the peeling flange 108. For instance, as described herein the peeling flange 108, in one example, is bounded along one or more sides by the die profile opening 114. The die profile opening 114 shapes the peeling flange 108 into a shape corresponding to the die 500. The die media 502, when positioned on the deflection plate 102, is ready for deflection with the die 500 aligned along the die profile opening 114 and the peeling flange 108.

In another example, curving the peeling flange 108 and the die media attached to the peeling flange includes one or more of rotating, bending, curling or arcing the peeling flange 108 from the flange end 110 toward a compliant hinge 112 coupling the peeling flange 108 with the remainder of the deflection plate 102, such as the plate perimeter 116. As described herein, curving the peeling flange includes, but is not limited to, one or more of deflecting, rotating, bending, arcing, curling the peeling flange 108 or the like. Accordingly, in some examples, the peeling flange remains substantially straight (without a bend or arc) in some examples and, in other examples, is constructed with a deformable material such as spring steel or the like configured to bend, curl, arc or the like relative to the remainder of the deflection plate 102 when deflected (e.g., by the movable stage 200).

In still another example, initiating the linear separation gap 504 includes controlling the shape of the linear separation gap 504 with one or more of the shape of the flange end 110 or the shape of the die profile opening 114 between the peeling flange 108 and the remainder of the deflection plate 102 such as the plate perimeter 116. Accordingly, by changing the shape of the die profile opening 114 or the shape of the peeling flange 108, the initiated linear separation gap 504 is, in one example, tuned to have differing shapes, for instance, linear shapes extending around the interface between the die media 502 to the die 500. In some examples, the linear separation gap 504 provides a horseshoe or multi-faceted linear gap between the die 500 and the die media 502 corresponding to each of the sides of the peeling flange 108 separated from the remainder of the plate perimeter 116. Accordingly, in one example, the linear separation gap 504 includes a horseshoe or C-shaped linear separation gap 504 that begins at the flange end 110 and extends at least partially to the sides of the peeling flange 108 (e.g., extending from the flange end 110 toward the compliant hinge 112. With continued deflection of the peeling flange 108, the C-shaped linear separation gap 504, in such an example, propagates toward the compliant hinge 112, for instance, in a continuing C or horseshoe linear shape that decouples the die 500 from the die media 502 as shown again in FIG. 5C.

VARIOUS NOTES & EXAMPLES

Example 1 includes subject matter, such as can include a decoupling system comprising: a deflection plate configured for coupling across a low pressure orifice of a low pressure chamber, the deflection plate includes: one or more vacuum pores extending through the deflection plate, a peeling flange coupled with a remainder of the deflection plate at a compliant joint, and the peeling flange extends from the compliant joint to a flange end, and a die profile opening extending from the compliant joint around the peeling flange in the shape of a die profile, the die profile opening separates the peeling flange from the remainder of the deflection plate; and wherein the peeling flange includes relaxed and peeling configurations configured to decouple a die from a die media: in the relaxed configuration the peeling flange is coincident with the remainder of the deflection plate, and in the peeling configuration the peeling flange is deflected relative to the remainder of the deflection plate at the compliant joint and the flange end is spaced from the remainder of the deflection plate.

Example 2 can include, or can optionally be combined with the subject matter of Example 1, to optionally include wherein in the relaxed configuration the die media is fastened along the peeling flange and the remainder of the deflection plate, and in the peeling configuration the die media remains fastened along the peeling flange and the remainder of the deflection plate, and a linear separation gap is between the die media and the die according to the deflection of the peeling flange.

Example 3 can include, or can optionally be combined with the subject matter of one or any combination of Examples 1 or 2 to optionally include wherein the linear separation gap includes a shape corresponding to a shape of one or more of a portion of the die profile opening or the flange end.

Example 4 can include, or can optionally be combined with the subject matter of one or any combination of Examples 1-3 to optionally include wherein the peeling flange includes a decoupled configuration, and in the decoupled configuration: the peeling flange is further deflected relative to the peeling configuration, and the linear separation gap moves toward the compliant hinge according to the further deflection.

Example 5 can include, or can optionally be combined with the subject matter of one or any combination of Examples 1-4 to optionally include wherein the deflection plate, the compliant joint and the peeling flange are constructed with the same material.

Example 6 can include, or can optionally be combined with the subject matter of Examples 1-5 to optionally include wherein the compliant joint includes a living hinge.

Example 7 can include, or can optionally be combined with the subject matter of Examples 1-6 to optionally include wherein the peeling flange is a cantilever flange.

Example 8 can include, or can optionally be combined with the subject matter of Examples 1-7 to optionally include wherein the peeling flange includes a peeling lug near the flange end, and the peeling lug is configured for coupling with a movable stage of a decoupler assembly.

Example 9 can include, or can optionally be combined with the subject matter of Examples 1-8 to optionally include wherein the remainder of the deflection plate includes a plate perimeter extending around at least a portion of the peeling flange, and the die profile opening separates the plate perimeter from at least the flange end of the peeling flange.

Example 10 can include, or can optionally be combined with the subject matter of Examples 1-9 to optionally include a decoupler housing including the low pressure orifice and the low pressure chamber; a movable stage within the low pressure chamber, the movable stage is coupled with the peeling flange; the die adhered along the die media; and a picking assembly configured to selectively fasten with the die along a die interface.

Example 11 can include, or can optionally be combined with the subject matter of Examples 1-10 to optionally include a decoupling system comprising: a decoupler assembly configured to decouple a die from a die media, the decoupler assembly includes: a decoupler housing including a low pressure chamber, a movable stage within the decoupler housing, and a deflection plate coupled with the decoupler housing, the deflection plate includes: one or more vacuum pores in communication with the low pressure chamber, a compliant joint, a die profile opening extending from the compliant joint, and a peeling flange extending from the compliant joint to a flange end, the peeling flange within the die profile opening, and the peeling flange is coupled with the movable stage near the flange end.

Example 12 can include, or can optionally be combined with the subject matter of Examples 1-11 to optionally include wherein the peeling flange is configured for deflection between relaxed and peeling configurations: in the relaxed configuration the peeling flange is coincident with the remainder of the deflection plate, and in the peeling configuration the peeling flange is curved relative to the relaxed configuration with the movable stage, and a linear separation gap is initiated between the die and the die media according to the curve.

Example 13 can include, or can optionally be combined with the subject matter of Examples 1-12 to optionally include wherein the peeling flange includes a decoupled configuration, and in the decoupled configuration: the peeling flange is further curved relative to the peeling configuration, and the linear separation gap moves toward the compliant hinge according to the further deflection.

Example 14 can include, or can optionally be combined with the subject matter of Examples 1-13 to optionally include wherein the linear separation gap includes a shape corresponding to a shape of one or more of a portion of the die profile opening or the flange end.

Example 15 can include, or can optionally be combined with the subject matter of Examples 1-14 to optionally include wherein the vacuum pores and the low pressure chamber are configured to fasten the media with the peeling flange in each of the relaxed and the pealing configurations.

Example 16 can include, or can optionally be combined with the subject matter of Examples 1-15 to optionally include a picking assembly above the peeling flange, the picking assembly includes a die interface configured to hold the die static in each of the relaxed and peeling configurations.

Example 17 can include, or can optionally be combined with the subject matter of Examples 1-16 to optionally include wherein the decoupler assembly includes a transmission coupled between the peeling flange and the movable stage, the transmission is configured translate a first motion of the movable stage into a second motion of the peeling flange, the second motion different than the first motion.

Example 18 can include, or can optionally be combined with the subject matter of Examples 1-17 to optionally include wherein the decoupler assembly includes a transmission coupled between the peeling flange and the movable stage, the transmission includes: a roller bearing engaged with the movable stage, a lever coupled with the roller bearing on a drive end of the lever, the lever including a driven end opposed to the drive end, an axle extending through the lever, and the lever is configured to rotate around the axle, and a peeling lug coupling the driven end with the peeling flange.

Example 19 can include, or can optionally be combined with the subject matter of Examples 1-18 to optionally include wherein the deflection plate, the compliant joint and the peeling flange are unitary.

Example 20 can include, or can optionally be combined with the subject matter of Examples 1-19 to optionally include a method for decoupling a die from a die media comprising: fastening the die media to a deflection plate including a peeling flange extending to a flange end, the die is bonded with the die media; retaining the die in a static position; deflecting the peeling flange and the die media relative to the die, deflecting including: curving the peeling flange and the die media fastened to the peeling flange while retaining the die in the static position, initiating a linear separation gap between the die and the die media near the flange end according to the profile of the flange end, and propagating the linear separation gap along the die according to continued curving of the peeling flange.

Example 21 can include, or can optionally be combined with the subject matter of Examples 1-20 to optionally include wherein fastening the die media to the deflection plate includes fastening with one or more vacuum ports in the deflection plate including the peeling flange.

Example 22 can include, or can optionally be combined with the subject matter of Examples 1-21 to optionally include wherein fastening the die media to the deflection plate includes aligning the die with the peeling flange.

Example 23 can include, or can optionally be combined with the subject matter of Examples 1-22 to optionally include wherein retaining the die in the static position includes fastening the die to a die interface of a picking assembly.

Example 24 can include, or can optionally be combined with the subject matter of Examples 1-23 to optionally include wherein curving the peeling flange and the die media includes rotating and bending the peeling flange from the flange end toward a compliant hinge coupling the peeling flange with a remainder of the deflection plate.

Example 25 can include, or can optionally be combined with the subject matter of Examples 1-24 to optionally include wherein initiating a linear separation gap includes controlling the shape of the linear separation gap with one or more of the shape of the flange end or a die opening profile between the peeling flange and the remainder of the deflection plate.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

The claimed invention is:

1. A decoupling system comprising:
   a deflection plate configured for coupling across a low pressure orifice of a low pressure chamber, the deflection plate includes:
      one or more vacuum pores extending through the deflection plate;
      a peeling flange coupled with a remainder of the deflection plate at a compliant joint, and the peeling flange extends from the compliant joint to a flange end; and
      a die profile opening extending from the compliant joint around the peeling flange in the shape of a die profile, the die profile opening separates the peeling flange from the remainder of the deflection plate; and
   wherein the peeling flange includes relaxed and peeling configurations configured to decouple a die from a die media:
      in the relaxed configuration the peeling flange is coincident with the remainder of the deflection plate; and
      in the peeling configuration the peeling flange is deflected relative to the remainder of the deflection plate at the compliant joint and the flange end is spaced from the remainder of the deflection plate.

2. The decoupling system of claim 1, wherein in the relaxed configuration the die media is fastened along the peeling flange and the remainder of the deflection plate; and
   in the peeling configuration the die media remains fastened along the peeling flange and the remainder of the deflection plate, and a linear separation gap is between the die media and the die according to the deflection of the peeling flange.

3. The decoupling system of claim 1, wherein the linear separation gap includes a shape corresponding to a shape of one or more of a portion of the die profile opening or the flange end.

4. The decoupling system of claim 2, wherein the peeling flange includes a decoupled configuration, and in the decoupled configuration:
   the peeling flange is further deflected relative to the peeling configuration; and
   the linear separation gap moves toward the compliant hinge according to the further deflection.

5. The decoupling system of claim 1, wherein the deflection plate; the compliant joint and the peeling flange are constructed with the same material.

6. The decoupling system of claim 1, wherein the compliant joint includes a living hinge.

7. The decoupling system of claim 1, wherein the peeling flange is a cantilever flange.

8. The decoupling system of claim 1, wherein the peeling flange includes a peeling lug near the flange end, and the peeling lug is configured for coupling with a movable stage of a decoupler assembly.

9. The decoupling system of claim 1, wherein the remainder of the deflection plate includes a plate perimeter extending around at least a portion of the peeling flange, and the die profile opening separates the plate perimeter from at least the flange end of the peeling flange.

10. The decoupling system of claim 1 comprising:
    a decoupler housing including the low pressure orifice and the low pressure chamber;
    a movable stage within the low pressure chamber, the movable stage is coupled with the peeling flange;
    the die adhered along the die media; and
    a picking assembly configured to selectively fasten with the die along a die interface.

11. A decoupling system comprising:
    a decoupler assembly configured to decouple a die from a die media, the decoupler assembly includes:
    a decoupler housing including a low pressure chamber;
    a movable stage within the decoupler housing; and
    a deflection plate coupled with the decoupler housing, the deflection plate includes:
    one or more vacuum pores in communication with the low pressure chamber;
    a compliant joint;
    a die profile opening extending from the compliant joint; and
    a peeling flange extending from the compliant joint to a flange end, the peeling flange within the die profile opening, and the peeling flange is coupled with the movable stage near the flange end.

12. The decoupling system of claim 11, wherein the peeling flange is configured for deflection between relaxed and peeling configurations:
    in the relaxed configuration the peeling flange is coincident with the remainder of the deflection plate; and in the peeling configuration the peeling flange is curved relative to the relaxed configuration with the movable stage, and a linear separation gap is initiated between the die and the die media according to the curve.

13. The decoupling system of claim 12, wherein the peeling flange includes a decoupled configuration, and in the decoupled configuration:
the peeling flange is further curved relative to the peeling configuration; and
the linear separation gap moves toward the compliant hinge according to the further deflection.

14. The decoupling system of claim 11, wherein the linear separation gap includes a shape corresponding to a shape of one or more of a portion of the die profile opening or the flange end.

15. The decoupling system of claim 11, wherein the vacuum pores and the low pressure chamber are configured to fasten the media with the peeling flange in each of the relaxed and the peeling configurations.

16. The decoupling system of claim 11 comprising a picking assembly above the peeling flange, the picking assembly includes a die interface configured to hold the die static in each of the relaxed and peeling configurations.

17. The decoupling system of claim 11, wherein the decoupler assembly includes a transmission coupled between the peeling flange and the movable stage, the transmission is configured to translate a first motion of the movable stage into a second motion of the peeling flange, the second motion different than the first motion.

18. The decoupling system of claim 11, wherein the decoupler assembly includes a transmission coupled between the peeling flange and the movable stage, the transmission includes:
a roller bearing engaged with the movable stage;
a lever coupled with the roller bearing on a drive end of the lever, the lever including a driven end opposed to the drive end;
an axle extending through the lever, and the lever is configured to rotate around the axle, and a peeling lug coupling the driven end with the peeling flange.

19. The decoupling system of claim 11, wherein the deflection plate, the compliant joint and the peeling flange are unitary.

* * * * *